United States Patent [19]

Takamura et al.

[11] Patent Number: 4,891,824
[45] Date of Patent: Jan. 2, 1990

[54] MUTING CONTROL CIRCUIT

[75] Inventors: Yoshinobu Takamura, Tokyo; Norimichi Katsumura, Yamanashi; Nobuhiko Osawa, Yamanashi; Kazuo Watanabe, Yamanashi, all of Japan

[73] Assignees: Pioneer Electronic Corporation, Tokyo; Pioneer Video Corporation, Yamanashi, both of Japan

[21] Appl. No.: 293,852

[22] Filed: Jan. 5, 1989

[30] Foreign Application Priority Data

Jun. 16, 1988 [JP] Japan .................................. 63-148916

[51] Int. Cl.⁴ .............................................. H04B 1/26
[52] U.S. Cl. .................................... 375/104; 455/174; 455/225; 455/316
[58] Field of Search ...................... 375/5, 104, 81, 120, 375/97; 329/50, 122; 331/DIG. 2; 371/61; 455/218, 225, 174, 260, 316

[56] References Cited

U.S. PATENT DOCUMENTS

| 4,232,393 | 11/1980 | Kumaoka et al. | ............ 331/DIG. 2 |
| 4,355,417 | 10/1982 | Kozak Jr. | .................. 455/218 |
| 4,430,742 | 2/1984 | Milleker et al. | ....................... 375/104 |
| 4,547,902 | 10/1985 | Kasperkovitz | ....................... 455/218 |
| 4,691,175 | 9/1987 | Ecklund | ........................ 331/DIG. 2 |

OTHER PUBLICATIONS

"Digital Audio Interface", *Nikkei Electronics*, pp. 109–118:1987.

Primary Examiner—Benedict V. Safourek
Attorney, Agent, or Firm—Sughrue, Mion, Zinn, Macpeak & Seas

[57] ABSTRACT

A muting control circuit is provided in which muting is performed when any one of a plurality of unlock detection signals is detected, indicating circuits is unlocked or when a data error is detected in a demodulator. In this way, reading time can be shortened to the minimum time required for muting. In addition, when one unlock detection circuit is triggered due to a disorder in the input, the unlock detection signal is provided immediately, so that the muting control signal is supplied and muting can be performed even when there is a time delay before the unlock detection circuit detects an unlocked state.

7 Claims, 1 Drawing Sheet

MUTING CONTROL CIRCUIT

BACKGROUND OF THE INVENTION

1. Field of the Invention

The present invention relates to a muting control circuit, and particularly relates to a muting control circuit in a digital audio data processing circuit.

2. Description of the Prior Art

FIG. 2 shows a receiving circuit of a digital audio interface having a conventional muting control circuit. In FIG. 2, a demodulator 1 is supplied through an input terminal IN with digital audio interface data, e.g., which have been provided from a digital audio disk player (not-shown) and have then been modulated, for example, by a biphase mark modulation system according to EIAJ Standards.

The demodulator 1 demodulates the digital audio interface data by using a clock generated by a PLL (Phase Locked Loop) circuit 2 and generates a data error detection signal upon detection of a data error. The PLL circuit 2 uses the input digital audio interface data as a reference signal so as to control the oscillation frequency of a clock generating VCO (Voltage-Controlled Oscillator) in accordance with the phase difference between the reference signal and the output of the VCO.

The output data of the demodulator 1 are supplied to a digital filter 3 and, at the same time, the clock signal from the demodulator 1 is supplied to a PLL circuit 4. The digital filter 3 performs a filter processing and an oversampling processing on the input data by using a clock signal output from the PLL circuit 4. The PLL circuit 4 uses the output of the demodulator 1 as a reference signal so as to control the oscillation frequency of the clock generating VCO in accordance with the phase difference between the reference signal and the output of the VCO.

The digital audio data oversampled by the digital filter 3 is supplied to a digital-to-analog (hereinafter abbreviated as "D/A") converter 5 so as to be converted into an analog audio signal. The output of the D/A converter 5 is supplied to an output terminal OUT through an analog switch 6.

The output of a muting control circuit 7 is supplied to a control input terminal of the analog switch 6. The muting control circuit 7 is supplied with a data error detection signal from the demodulator 1 and with a phase difference signal from the PLL circuit 2, for example, corresponding to the phase difference between the reference signal and the output of the VCO. In the muting control circuit 7, the phase difference signal is supplied to an unlock detecting circuit 8. The unlock detecting circuit 8 provides an unlock detection signal indicating an unlocked state of the PLL circuit 2 when it detects that the phase difference between the reference signal (i.e., the received data) and and output of the VCO in the PLL circuit 2 exceeds a predetermined value. The unlock detection signal and the data error detection signal from the unlock detecting circuit 8 and the demodulator 1, respectively, are supplied to a trigger input terminal of a timer 10 through an OR gage 9. The timer 10 outputs a muting control signal for a period during which at least one of the unlock detection signal and the data error detection signal exists, and for a predetermined period after both of the unlock detection signal and the data error detection signal have disappeared. The analog switch 6 is off during the presence of the muting control signal, thereby performing muting.

In the above-mentioned arrangement, the data error detection signal disappears after the PLL circuit 2 becomes locked so that a normal demodulation processing is performed in the demodulator 1. Here, in the case where the data error detection signal disappears at the same time as the PLL circuit 2 becomes locked, the duration of the muting control signal, i.e., the muting time $T_1$ is expressed by, $$T_1 = t_1 + t_0 \qquad (1)$$

where $t_1$ represents a duration from a point in time when a normal reference signal begins to be supplied to the PLL circuit 2 to a point in time when the PLL circuit 2 becomes locked (this time duration hereinafter being referred to as a "lock time"), and $t_0$ represents the period of time, determined by the timer 10, for which the muting signal continues after both of the unlock detection signal and the data error detection signal have disappeared. Although the lock time $t_1$ is a time which can be detected by the unlock detecting circuit 8, it is necessary to establish the period of time $t_0$ to be equal to or longer than the lock time of the PLL circuit 4 to thereby prevent generation of an abnormal sound or the like. Since the lock time of the PLL circuit 4 depends on the deviation in frequency which the PLL circuit 4 follows, it is necessary to make the period of time $t_0$ be a sum of the maximum value $t_{2max}$ of the lock time of the PLL circuit 4 and the margin time $t_3$ for variations in the lock time of the PLL circuit 4. Accordingly, the equation (1) can be transformed as follows.

$$T_1 = t_1 + t_{2max} + t_3 \qquad (2)$$

In the conventional muting control circuit, therefore, even after the PLL circuits 2 and 4 have become locked, excessive muting is performed for the period of time corresponding to the difference between the maximum value $t_{2max}$ of the lock time of the PLL circuit 4 and its actual time, and for the margin period of time $t_3$. Moreover, in the case where a data error detection signal exists even after the PLL circuit 2 has become locked state, the muting time is unnecessarily prolonged because the muting is carried out excessively for the period of $t_{2max} + t_3$ after this data error detection signal has disappeared.

SUMMARY OF THE INVENTION

It is therefore an object of the present invention to solve the foregoing problems in the prior art.

It is another object of the present invention to provide a muting control circuit by which muting time can be shortened to the minimum time required for muting.

In order to attain the foregoing objects, the muting control circuit according to the present invention is arranged so that a muting control signal is provided when there exists at least one of a data error detection signal and an unlock detection signal which gives an indication of detection of a unlocked state of a PLL circuit for generating a data processing clock for the digital audio data.

The muting control circuit according to the present invention may be arranged so that the muting control signal is provided also upon detection of an unlocked state of PLL circuit for generating a clock for the demodulation of the digital audio data to thereby perform muting more reliably.

BRIEF DESCRIPTION OF THE DRAWINGS

Other features and advantages of the present invention will be apparent from the following description taken in connection with the accompanying drawings, wherein.

DETAILED DESCRIPTION OF THE PREFERRED EMBODIMENT

An embodiment of the present invention will now be described with reference to FIG. 1.

Figure 1:
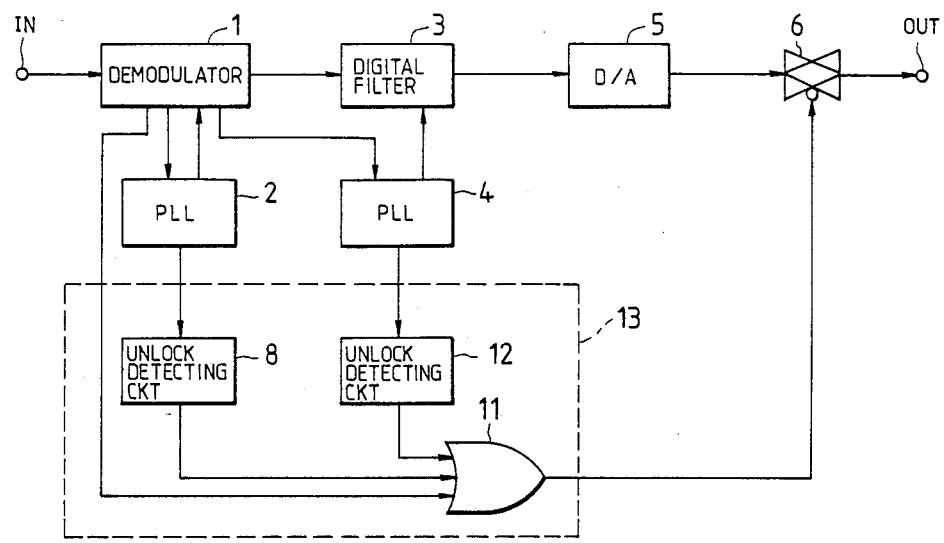
FIG. 1 is a block diagram illustrating an embodiment of the present invention.
Figure 2:
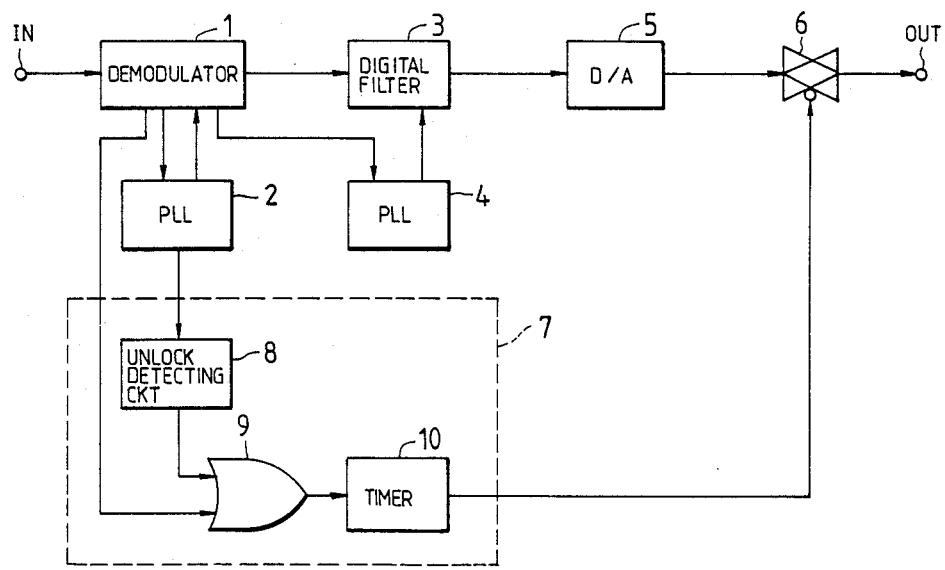
FIG. 2 is a block diagram illustrating a conventional muting control circuit.

In FIG. 1, a demodulator 1, PLL circuits 2 and 4, a digital filter 3, a D/A converter 5, an analog switch 6 and a muting control circuit are connected in the same manner as those in the apparatus of FIG. 2. In this embodiment, however, the muting control circuit 13 includes not only the unlock detecting circuit 8 but also an unlock detecting circuit 12, with the two-input OR gate of FIG. 2 being replaced with a three-input OR gate 11. An output signal of the unlock detecting circuit 8 and a data error detection signal from the demodulator 1 are supplied to two inputs of the three-input OR gate 11, and an output signal of the unlock detecting circuit 12 is supplied to the remaining input of the three-input OR gate 11. The unlock detecting circuit 12 is arranged, for example, to generate an unlock detection signal when the phase difference between a reference signal and an output signal of a VCO in the PLL circuit 4 exceeds a predetermined value. The respective unlock detection signals from the unlock detecting circuits 8 and 12 and the data error detection signal from the demodulator 1 are supplied through the three-input OR gate 11 to the analog switch 6 as a muting control signal output of the muting control circuit 13 according to the present invention. The analog switch 6 is turned off by the muting control signal from the muting control circuit 13, thereby performing muting.

The muting time $T_2$ in the above-mentioned arrangement is expressed by, $$T_2 = t_1 + t_2 \tag{3}$$

where $t_1$ represents the lock time of the PLL circuit 2, and $t_2$ represents the lock time of the PLL circuit 4.

In the equation (3), the margin time $t_3$ for deviations in the lock time of the PLL circuit 4 as shown in the equation (2) does not exist, and the time $t_2$ is equal to or shorter than $t_{2max}$, so that the relation $T_2 < T_1$ is established and the muting time is shortened. In the case where the data error detection signal exists even after the PLL circuit 2 has become locked, the muting time is expressed by the equation (3) as long as the data error detection signal disappears before the PLL circuit 4 becomes locked, so that the muting time is shortened also in this case. In the case where the data error detection signal exists even after the PLL circuit 4 has become locked, on the other hand, the muting control signal disappears at the same time as the data error detection signal disappears, so that the muting time is shortened in comparison with the same case in the circuit of FIG. 2 in which the muting control signal exists for the period of time of $t_{2max} + t_3$ after the data error detection signal has disappeared.

As has been described above, muting is performed only when one of the PLL circuits 2 and 4 is unlocked or when a data error is detected in the demodulator 1, so that the muting time can be shortened to the minimum time required for muting. Moreover, when the PLL circuit 2 has become unlocked due to a disorder in input digital audio interface data and so on, in spite of normal operation of respective circuit portions, the unlock detection signal is provided from the unlock detecting circuit 8 immediately, so that the muting control signal is supplied to the analog switch 6 and muting can be performed surely even in the case where a time delay exists before the PLL circuit 4 has become unlocked.

In the case where the unlock detecting circuits 8 and 12 are arranged so that the respective unlocked states of the PLL circuits 2 and 4 are detected in synchronism with the respective clocks output from the PLL circuits 2 and 4, so as to output an unlock detection signal in the form of a pulse signal having the same waveform as that of the clocks, it is preferable that a timer be connected between the OR gate 11 and the analog switch 6 so as to prevent the operation from becoming unstable due to repetition of on/off operation of the analog switch 6 with a high frequency. A suitable "hangover" time for the timer would be on the order of 20–40 ms.

Although the unlock detecting circuit 8 is provided in the above-mentioned embodiment in the same manner as in the conventional circuit, the PLL circuit 4 does not become locked unless the PLL circuit 2, whose unlocked state is detected by this unlock detecting circuit 8, becomes locked. Accordingly, the unlock detecting circuit 8 may be eliminated, if desired.

Although the clock from the PLL circuit 4 is supplied to the digital filter 3 in the above-mentioned embodiment, the present invention is not limited to this case but is applicable also to the case where the clock from the PLL circuit 4 is supplied to other processing means such as a digital signal processor or the like.

Further, a digital switch may be provided between the digital filter 3 and the D/A converter 5, instead of the analog switch 6.

As has been described in detail, the muting control circuit according to the present invention is arranged so that a muting control signal is provided when there exists at least one of (1) a data error detection signal which is generated when a data error is detected in a demodulating means for demodulating modulated digital audio data and (2) an unlock detection signal which indicates an unlocked state of a PLL circuit for generating a data processing clock for the digital audio data. Accordingly, the muting time can be shortened to the minimum one required for muting while still preventing generation of an abnormal sound by imperfect demodulation due to occurrence of a data error or by data processing due to the occurrence of an abnormal clock.

Moreover, by arranging the circuit so as to provide the muting control signal also upon detection of an unlocked state of the PLL circuit for generating a clock for demodulating the digital audio data, the muting control signal is provided immediately when the demodulation clock generating PLL circuit becomes unlocked due to a disorder or the like of the input digital audio interface data in spite of normal operation of respective circuit portions, so that muting can be ensured even when a time lag exists before the PLL circuit 4 has become unlocked.

What is claimed is:

1. A muting control circuit for a digital audio data processing circuit comprising a first phase locked loop circuit for generating a data processing clock, a second phase locked loop circuit for generating a demodulation clock, a demodulation means for demodulating said digital audio data by using said demodulation clock, and a data processing means for processing output data of said demodulation means by using said data processing clock, a muting circuit responsive to a muting control signal for muting an output of said digital audio data processing circuit, and a muting control circuit for generating said muting control signal, said muting control circuit comprising:

first unlock detecting means for generating a first unlock detection signal when said first phase locked loop circuit is in an unlocked state; and a muting control signal generating means for producing said muting control signal in response to said first unlock detection signal.

2. A muting control circuit as claimed in claim 1, wherein said demodulation means generates a data error signal if a data error is detected in said data, and wherein said muting control signal generating means, in addition to producing said muting control signal in response to said first unlock detection signal, also produces said muting control signal in response to said data error detection signal.

3. A muting control circuit as claimed in claim 1, further comprising second unlock detecting means for generating a second unlock detection signal when said second phase locked loop circuit is in an unlocked state, wherein said muting control signal generating means, in addition to producing said muting control signal in response to said first unlock detection signal, also produces said muting control signal in response to said second unlock detection signal.

4. A muting control circuit as claimed in claim 3, wherein said demodulation means generates a data error signal if a data error is detected in said data, and wherein said muting control signal generating means, in addition to producing said muting control signal in response to said first unlock detection signal and in response to said second unlock detection signal, also produces said muting control signal in response to said data error detection signal.

5. A muting control circuit as claimed in claim 4, wherein said muting control signal generating means comprises a timer at an output of said muting control signal generating means.

6. A muting control circuit as claimed in claim 1, wherein said muting control signal generating means comprises an OR gate.

7. A muting control circuit as claimed in claim 4, wherein said muting control signal generating means comprises an OR gate.

* * * * *